United States Patent
Ivanov et al.

(10) Patent No.: US 9,476,924 B2
(45) Date of Patent: Oct. 25, 2016

(54) SENSOR SYSTEM AND METHOD FOR REDUCING A SETTLING TIME OF A SENSOR SYSTEM

(71) Applicant: Microchip Technology German II GmbH & Co. KG, Gilching (DE)

(72) Inventors: Artem Ivanov, Landshut (DE); Ce Zhang, Munich (DE)

(73) Assignee: MICROCHIP TECHNOLOGY GERMANY GMBH, Gilching (DE)

( * ) Notice: Subject to any disclaimer, the term of this patent is extended or adjusted under 35 U.S.C. 154(b) by 15 days.

(21) Appl. No.: 14/363,938

(22) PCT Filed: Dec. 6, 2012

(86) PCT No.: PCT/EP2012/074717
§ 371 (c)(1),
(2) Date: Jun. 9, 2014

(87) PCT Pub. No.: WO2013/083736
PCT Pub. Date: Jun. 13, 2013

(65) Prior Publication Data
US 2015/0097585 A1  Apr. 9, 2015

(30) Foreign Application Priority Data
Dec. 9, 2011 (DE) .................... 10 2011 056 226

(51) Int. Cl.
*G01R 27/26* (2006.01)
*G01D 5/241* (2006.01)
(Continued)

(52) U.S. Cl.
CPC ............. *G01R 27/2605* (2013.01); *G01D 5/24* (2013.01); *G01D 5/241* (2013.01); *G06F 3/016* (2013.01); *H03K 17/955* (2013.01); *H03K 17/962* (2013.01); *H03K 17/9622* (2013.01)

(58) Field of Classification Search
CPC .......... G01R 27/2605; H03K 17/955; H03K 17/962; H03K 17/9622; G06F 3/016; G01D 5/24; G01D 5/241; G01D 5/2412; G01D 5/2417
USPC ....... 324/600, 649, 658, 660, 661, 679, 684, 324/686; 702/47, 52
See application file for complete search history.

(56) References Cited

U.S. PATENT DOCUMENTS 5,543,591 A    8/1996 Gillespie et al. .......... 178/18.03
7,432,724 B2 * 10/2008 Goto ................. G01R 27/2605
                                                            324/658

(Continued)

FOREIGN PATENT DOCUMENTS

DE    102009055143 A1    6/2011    ............... F24C 7/08
WO    2013/083736 A1    6/2013    ........... H03K 17/955

OTHER PUBLICATIONS

International Search Report and Written Opinion, Application No. PCT/EP2012/074717, 10 pages, Apr. 24, 2013.

(Continued)

*Primary Examiner* — Hoai-An D Nguyen
(74) *Attorney, Agent, or Firm* — Slayden Grubert Beard PLLC

(57) ABSTRACT

A sensor system has a first sensor device and a second capacitive sensor device for detecting a movement of the object relative to a detection surface, wherein the sensor system is configured to be operated in a first mode of operation and in a second mode of operation, wherein the sensor system is configured to be switched over from the first mode of operation into the second mode of operation, wherein the second capacitive sensor device has a number of second sensor electrodes, and wherein in the sensor system at least in the second mode of operation at least one signal path connectable with a predetermined fixed electric potential is provided, which is parallel to a parasitic capacitance of the first sensor device.

13 Claims, 2 Drawing Sheets

(51) Int. Cl.
*G06F 3/01* (2006.01)
*G01D 5/24* (2006.01)
*H03K 17/955* (2006.01)
*H03K 17/96* (2006.01)

(56) References Cited

U.S. PATENT DOCUMENTS

| | | | | |
|---|---|---|---|---|
| 2004/0206190 A1* | 10/2004 | Kawahata | ............ | A61B 5/1172 73/862 |
| 2008/0116904 A1 | 5/2008 | Reynolds et al. | ............ | 324/678 |
| 2008/0202251 A1* | 8/2008 | Serban | ............ | G01L 1/142 73/780 |
| 2008/0246723 A1 | 10/2008 | Baumbach | ............ | 345/156 |
| 2009/0033343 A1 | 2/2009 | Reynolds et al. | ............ | 324/688 |
| 2010/0295559 A1 | 11/2010 | Osoinach | ............ | 324/658 |
| 2011/0043227 A1 | 2/2011 | Pance et al. | ............ | 324/681 |
| 2011/0199331 A1* | 8/2011 | Otagaki | ............ | G06F 3/044 345/174 |
| 2011/0215814 A1 | 9/2011 | Dorrough | ............ | 324/663 |
| 2011/0215819 A1* | 9/2011 | Dorrough | ............ | G01R 27/26 324/684 |
| 2012/0050214 A1* | 3/2012 | Kremin | ............ | G06F 3/0418 345/174 |

OTHER PUBLICATIONS

German Office Action, Application No. 102011056226.5, 9 pages, Apr. 28, 2016.
Chinese Office Action, Application No. 201280060739.0, 13 pages.
Taiwan Office Action, Application No. 101146256, 6 pages.

* cited by examiner

SENSOR SYSTEM AND METHOD FOR REDUCING A SETTLING TIME OF A SENSOR SYSTEM

CROSS-REFERENCE TO RELATED APPLICATIONS

This application is a U.S. National Stage Application of International Application No. PCT/EP2012/074717 filed Dec. 6, 2012, which designates the United States of America, and claims priority to DE Patent Application No. 10 2011 056 226.5 filed Dec. 9, 2011. The contents of which are hereby incorporated by reference in their entirety.

TECHNICAL FIELD

The invention relates to a sensor system and a method for reducing a settling time of a sensor system according to the invention. The invention further relates to a capacitive sensor device for detecting a contact by an object with a detection surface, which is designed to reduce the settling time of a further capacitive sensor device in a sensor system according to the invention.

BACKGROUND

Known in prior art are capacitive sensor devices for detecting a contact by an object with a detection surface. Such sensor devices also are known as capacitive touch sensors. Furthermore, known in prior art are capacitive sensor devices for detecting a movement of an object relative to a detection surface. These sensor devices also are known as capacitive movement sensors.

Contacts with a detection surface, for example by a finger, may be detected by means of the capacitive touch sensors, while movements of a finger relative to a detection surface and in a certain distance from the detection surface may be detected by means of capacitive movement sensors.

In this connection it is desired to detect contacts by a finger at a detection surface as well as movements of the finger in front of the detection surface relative to the detection surface. To do so, a sensor device may be provided, which comprises a capacitive touch sensor as well as a capacitive movement sensor. Both the capacitive touch sensor and the capacitive movement sensor each have a number of sensor electrodes by means of which a contact and a movement are detected, respectively. The sensor electrodes of the touch sensor and of the movement sensor are arranged relative to the detection surface such that in a certain area of the detection surface, preferably in the whole area of the detection surface, both a contact with the detection surface as well as a movement relative to the detection surface may be detected.

In order to detect both a contact as well as a movement by means of the respective capacitive sensor it may be required to operate the capacitive touch sensor and the capacitive movement sensor within different time intervals, so that in one instant of time always only one of the two capacitive sensors is active. In order to detect a contact as well as a movement ideally at the same time it may be advantageous to switch back and forth between the operation of the touch sensor and of the movement sensor within relatively short time intervals. This is to mean that when the touch sensor is active the movement sensor is inactive and vice versa.

However, switching over from the touch sensor to the movement sensor has the disadvantage that the output signal and the sensor signal, respectively, of the movement sensor has a relatively long settling phase immediately after the activation of the movement sensor, which may last several seconds, so that the sensor signal of the movement sensor in the worst case only may be evaluated correctly after several seconds. Settling times comprising durations that long are not acceptable for practical applications, in particular when a signal processing has to be carried out in real-time.

However, this problem also occurs when another sensor device is used instead of a touch sensor.

SUMMARY

According to various embodiments, solutions can be provided which allow for a combination of a sensor, in particular a touch sensor, and of a movement sensor, in order to detect both a contact with a detection surface as well as a movement of an object relative to the detection surface and wherein at least during switching over from the touch sensor to the movement sensor the settling time of the movement sensor is reduced and minimized, respectively.

According to various embodiments a sensor system may comprise a first sensor device and a second capacitive sensor device for detecting a movement of an object relative to a detection surface, by means of a method for reducing a settling time of a capacitive movement sensor in a sensor system, as well as by means of a capacitive sensor device for detecting a contact by an object with a detection surface according to the independent patent claims.

According to that, provided is a sensor system comprising a first sensor device and a second capacitive sensor device for detecting a movement of the object relative to a detection surface, wherein the sensor system may be operated in a first mode of operation and in a second mode of operation, wherein the sensor system may be switched over from the first mode of operation into the second mode of operation, wherein the second capacitive sensor device comprises a number of second sensor electrodes, and wherein in the sensor system at least in the second mode of operation at least one signal path connectable with a predetermined fixed electric potential is provided, which is parallel to a parasitic capacitance of the first sensor device.

The predetermined fixed electric potential at least may comprise one of ground potential, supply voltage, half of the supply voltage ($V_{CC}/2$), and an electric potential between ground potential and supply voltage.

The signal path may be connected with the predetermined electric potential via an electric resistance $R_{BYPASS}$.

By means of the signal path at least one terminal of the first sensor device may be coupled with the predetermined electric potential via the electric resistance $R_{BYPASS}$.

The first sensor device may comprise a capacitive sensor device for detecting a contact by an object with a detection surface, wherein the first capacitive sensor device comprises a number of first sensor electrodes, wherein in the first mode of operation a contact may be detected, and wherein in the second mode of operation the movement may be detected.

By means of the signal path
  at least one electrode of the first sensor electrodes may be coupled with the predetermined electric potential via the electric resistance $R_{BYPASS}$, or
  at least that first sensor electrodes may be coupled with the predetermined electric potential via a respective electric resistance $R_{BYPASS}$, whose distance from the second sensor electrodes is below a predetermined value.

Provided in the signal path may be a switching device, which is designed to connect the signal path with the predetermined fixed electric potential in the second mode of operation.

Furthermore, provided is a method for reducing a settling time of a second capacitive sensor device for detecting a movement of an object relative to a detection surface, wherein the second capacitive sensor device is part of a sensor system, which in addition comprises a first sensor device, wherein the sensor system is operated in a first mode of operation or in a second mode of operation, wherein at least in the second mode of operation in the sensor system at least one signal path is connected with a predetermined fixed electric potential, wherein the signal path is parallel to the parasitic capacitance of the first sensor device.

The signal path may be connected with the predetermined electric potential via an electric resistance $R_{BYPASS}$.

The first sensor device may comprise a capacitive sensor device for detecting a contact by an object with a detection surface, wherein the first capacitive sensor device comprises a number of first sensor electrodes, wherein in the first mode of operation a contact is detected, and wherein in the second mode of operation the movement is detected.

By means of the signal path
  at least one terminal of the first capacitive sensor device may be connected with the predetermined electric potential via the electric resistance $R_{BYPASS}$, or
  at least one electrode of the sensor electrodes of the first capacitive sensor device may be connected with the predetermined electric potential via the electric resistance $R_{BYPASS}$.

Further provided is a sensor device for detecting a contact by an object with a detection surface, wherein the sensor device comprises a number of sensor electrodes and wherein provided in the sensor device is at least one signal path connectable with a predetermined fixed electric potential, which is parallel to the parasitic capacitance of the sensor device.

By means of the signal path
  at least one terminal of the sensor device may be coupled with the predetermined electric potential via an electric resistance $R_{BYPASS}$, and/or
  at least one electrode of the sensor electrodes may be coupled with the predetermined electric potential via the electric resistance $R_{BYPASS}$.

The sensor device may comprise a capacitive sensor device.

BRIEF DESCRIPTION OF THE DRAWINGS

Details and characteristics of the invention as well as concrete embodiments of the invention result from the following description in connection with the drawing.

DETAILED DESCRIPTION

Figure 1:
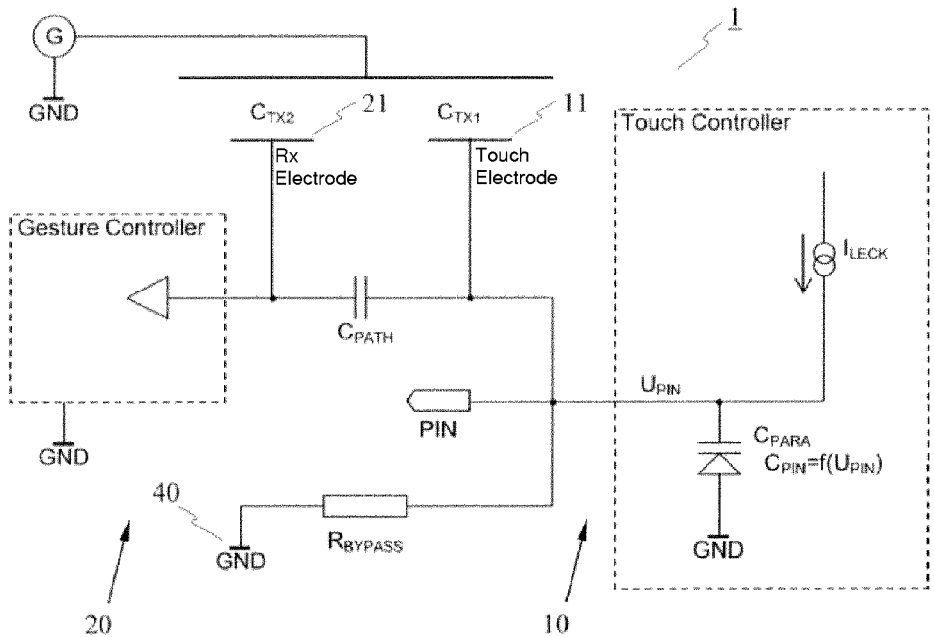
FIG. 1 shows a sensor system comprising a capacitive touch sensor and a capacitive movement sensor and which is adapted to reduce the settling time of the capacitive movement sensor.

FIG. 1 shows a sensor system 1 according to various embodiments, which comprises a capacitive sensor device 10 for detecting a contact by an object with a detection surface and a capacitive sensor device 20 for detecting a movement of an object relative to the detection surface. In the following, the capacitive sensor device 10 is designated as touch sensor, the capacitive sensor device 20 is designated as movement sensor. Instead of the touch sensor the sensor system 1 according to various embodiments also may comprise other sensor devices.

In the following, however, the various embodiments are described on the basis of a sensor system 1, which comprises a touch sensor and a movement sensor.

For convenience, only one sensor electrode 11 of the touch sensor 10 and only one sensor electrode 21 of the movement sensor 20 are shown in FIG. 1. In a concrete embodiment of the sensor system 1 the touch sensor 10 has a number of sensor electrodes 11 and the movement sensor 20 has a number of sensor electrodes 21.

The touch sensor 10 and the movement sensor 20 are operated alternately, this is to mean that touch and movement are detected alternately by means of operating the sensor system 1 alternately in a first mode of operation and in a second mode of operation.

In the second mode of operation (detection of a movement of an object relative to the detection surface by means of the movement sensor 20) the sensor electrode 21 of the movement sensor 20 measures the overall capacitance to ground, which consists of the capacitance of the object to be detected and an unavoidable parasitic capacitance (basic capacitance). The basic capacitance substantially is composed of the capacitance of the sensor electrode 21 of the movement sensor 20, the pin capacitance $C_{PIN}$ of the touch sensor 10 and the capacitance $C_{PATH}$. During the interpretation of the measurement results of the movement sensor 20 the basic capacitance is assumed to be constant. In practice this assumption has been confirmed by means of measurements carried out over extended time intervals. However, due to internal effects of semiconductor technology this assumption does not apply directly after the switching actions.

After switching over from the first mode of operation into the second mode of operation the de-activated touch sensor 10 theoretically should not show any effect on the above-mentioned basic capacitance. In practice, however, this basic capacitance is affected by the following effect:

A small leakage current $I_{Leck}$ always present in the real components leads to the fact that the DC potential at the terminals PIN of the touch sensor 10 varies over time as a result of the charge/discharge of the capacitances present at the terminal. As a result of the internal construction of the integrated circuit the internal capacitance depends on the voltage at the terminal, for example because the structures integrated as a protection against electrostatic discharges have p-n junctions (diodes), which normally are operated in a reverse-biased manner.

The voltage dependency of the diode capacitance is well known. These effects result in that the overall basic capacitance varies over time. The practical time constants of this variation have magnitudes of several seconds.

However, it is exactly this capacitance variation, which results in settling processes at the measurement signals of the movement sensor 20.

In order to reduce the settling time of the movement sensor 20 in any case in the second mode of operation, i.e. in the mode in which the movement of an object relative to the detection surface is detected, a signal path is provided that is connected with a fixed electric potential 40 and that is parallel to the parasitic capacitance of the touch sensor 10. In FIG. 1 the fixed electric potential 40 is ground GND of the sensor system. However, the fixed electric potential 40 also may be a supply voltage $V_{cc}$ or half of a supply voltage, $V_{cc}/2$. The fixed electric potential 40, however, also may be formed in another suitable manner and in particular may be between ground GND and supply voltage $V_{cc}$.

Here, provided in the signal path is an electric resistance $R_{BYPASS}$ via which the signal path is connected with the fixed electric potential 40. A terminal PIN of the touch sensor 10 may be coupled with the fixed electric potential 40 by means of the signal path. Likewise, the sensor electrode 11 of the touch sensor 10 may be coupled with the fixed electric potential 40. In both cases the coupling with the fixed electric potential 40 is carried out via the electric resistance $R_{BYPASS}$.

In an embodiment all the sensor electrodes 11 of the touch sensor 10 may be coupled with the fixed electric potential 40 via the electric resistance $R_{BYPASS}$.

However, it also may be advantageous, in particular to reduce the manufacturing costs of the sensor system, only to connect those sensor electrodes 11 of the touch sensor 10 with the fixed electric potential 40 via the electric resistance $R_{BYPASS}$ that are located in direct vicinity of the sensor electrodes 21 of the movement sensor 20. In this connection those sensor electrodes 11 may be selected whose distance from the next sensor electrode 21 falls below a certain value.

According to various embodiments the signal path for connecting the terminals PIN and for connecting the sensor electrodes 11 with the fixed electric potential 40 also may be formed without the electric resistance $R_{BYPASS}$. Providing the electric resistance $R_{BYPASS}$ in the signal path, however, has the advantage that the variation of potential at the terminal PIN during switching over from the first mode of operation into the second mode of operation may be adapted and adjusted, respectively, for example by providing respective resistance values.

Tests have shown that with a respective selection of resistance values the electric resistances $R_{BYPASS}$ do not affect the touch sensor 10 and do not affect the contact detection. The contact position and the contact, respectively, also are correctly detected when using the electric resistance $R_{BYPASS}$ in the signal path.

By means of providing the signal path the settling time of the movement sensor 20 after the changeover from the first mode of operation into the second mode of operation is reduced because the variation of the potential at the terminals PIN, which is caused by the changeover from the first mode of operation into the second mode of operation, is adapted correspondingly.

Figure 2:
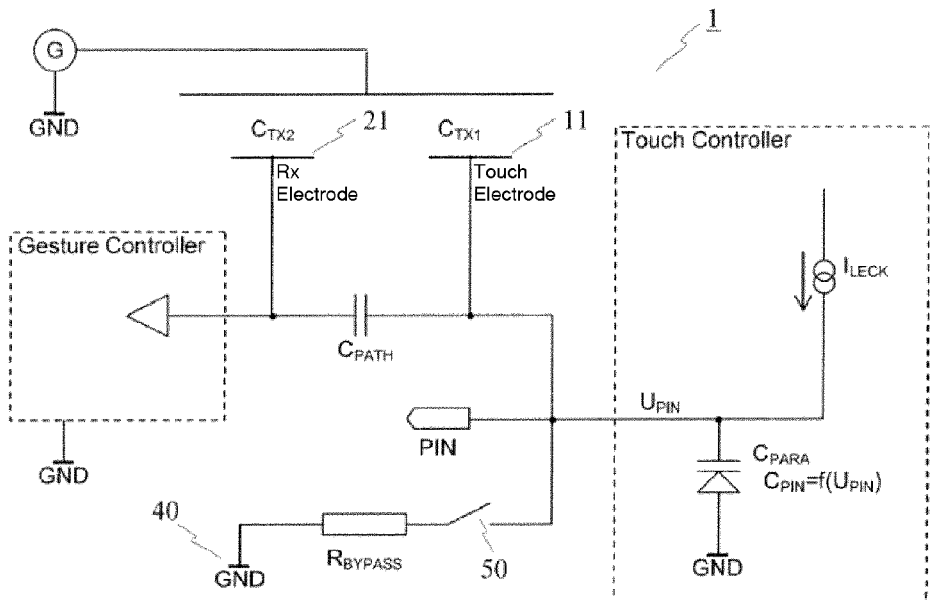
FIG. 2 shows an alternative embodiment of a sensor system.

FIG. 2 shows an alternative embodiment of a sensor system. The sensor system shown in FIG. 2 substantially corresponds to the sensor system shown in FIG. 1.

In the sensor system 1 shown in FIG. 2 an electric switch 50 is provided in the signal path to separate the signal path from the fixed electric potential 40. For example, it may be advantageous to open the electric switch 50 when the sensor device 1 is in the first mode of operation, in which a contact of the detection surface is detected, because then the movement detection is inactive and therefore no reduction of a settling time of the movement sensor 20 is required.

Figure 3A:
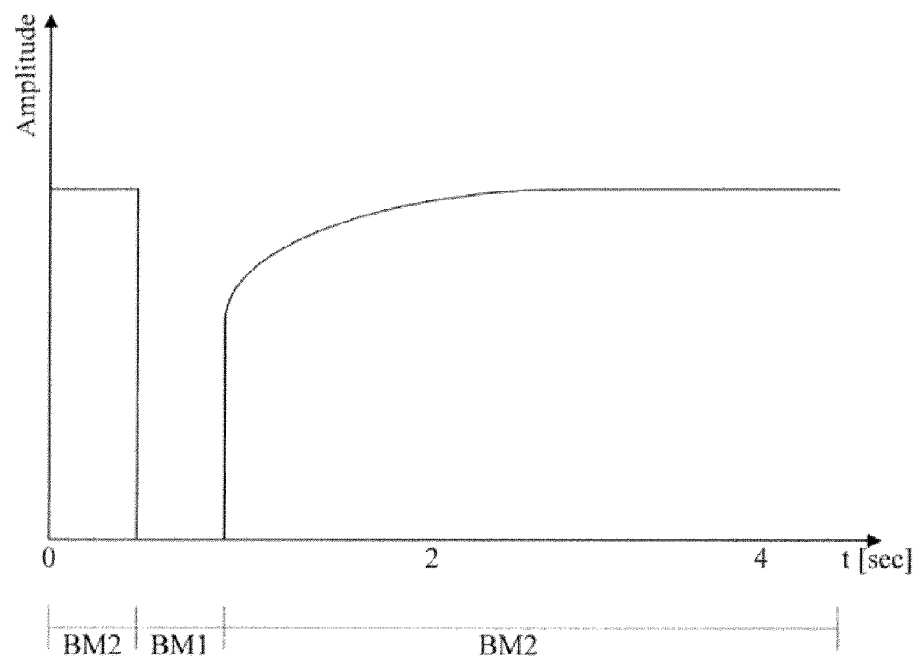
FIG. 3a shows the temporal course of a sensor signal of a capacitive movement sensor without a reduction of the settling time.

In a particular embodiment of the sensor system 1 the signal path also may be provided in the touch sensor 10 in order to connect the sensor electrodes 11 and the terminals PIN, respectively, with a fixed electric potential 40. FIG. 3a shows a signal course of a sensor signal of a movement sensor in a sensor system comprising a movement sensor and a touch sensor, wherein no measures for reducing the settling time of the movement sensor are provided. At first the sensor system is operated in the second mode of operation BM2. Thereafter a switchover from a second mode of operation BM2 into the first mode of operation BM1 is carried out, in which the contacting of a sensor surface by an object is detected. Subsequently a switchover from the first mode of operation BM1 into the second mode of operation BM2 is carried out.

As can be seen in FIG. 3a the signal requires a relatively long time until it has settled (about t=2 seconds). Only after the settlement of the signal it may be used for movement detection without further actions. Between the time of the switchover from the first mode of operation BM1 into the second mode of operation BM2 and the time at which the sensor signal has settled substantially, either no movement detection may be carried out or additional measures have to be provided in order to detect a movement from the signal not yet settled.

Figure 3B:
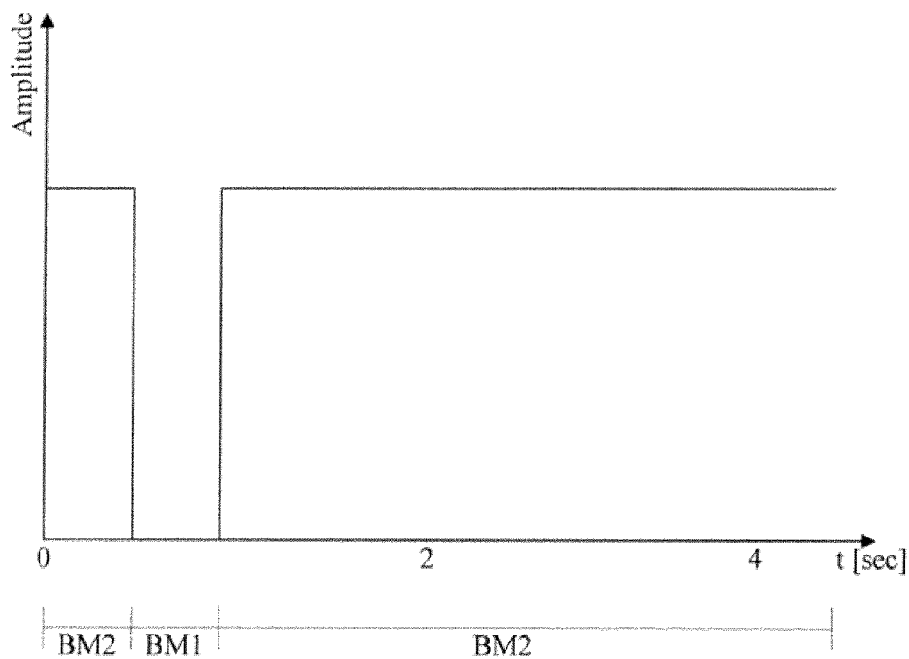
FIG. 3b shows the signal course of a sensor signal of a capacitive touch sensor comprising a reduction of the settling time.

FIG. 3b shows the course of a signal of a sensor signal of a movement sensor in a sensor system comprising a touch sensor and a movement sensor, wherein the sensor system provides the measures for reducing the settling time of the movement sensor described with relation to FIG. 1.

In contrast to the signal course shown in FIG. 3a the settling time of the movement sensor after the switchover from the first mode of operation BM1 into the second mode of operation BM2 has been reduced significantly and almost has been eliminated, respectively, wherein an idealized signal course is shown in FIG. 3b.

The reduction according to various embodiments of the settling time of the capacitive movement sensor has the advantage that almost immediately after the switchover into the second mode of operation BM2 a settled sensor signal is present so that already immediately after the switchover of the mode of operation a movement detection may be carried out without additional measures having to be provided, as it would be the case with a signal course according to FIG. 3a, for example.

The sensor system and the method according to various embodiments for reducing the settling time of the sensor signal of the movement sensor in addition have the advantage that noise in the sensor signal of the movement sensor is reduced significantly. A further advantage is that the signal processing is simplified considerably, because an extensive signal processing of the settling and not yet settled signal, respectively, may be forgone, so that more time and more calculating time, respectively, is available for other applications. In addition, the precision of detection of the movement detection may be improved significantly, because potential inaccuracies in the movement detection are eliminated to the greatest possible extent by means of the reduction of the settling time.

The sensor system according to various embodiments, for example, may be used in devices, in particular electric handheld devices, which comprise a touch sensitive and approach sensitive input surface, for example a touch panel. For example, the electric handheld device may be a mobile cell phone, a cordless telephone, a mobile mini-computer, a tablet PC or the like.

Furthermore it is possible according to various embodiments to combine commercially available and existing touch sensors, respectively, with a movement sensor in order to provide a sensor system according to various embodiments. In this connection it only has to be ensured that a corresponding signal path, if applicable comprising an electric resistance $R_{BYPASS}$ is provided in the sensor system, which connects the sensor electrodes and/or the terminals of the touch sensor at least in the second mode of operation of the sensor system with a fixed electric potential.

Furthermore it is possible according to various embodiments to integrate the above described electric resistance $R_{BYPASS}$ directly into the touch sensor. The touch sensor often only is an integrated circuit IC or a single chip system SoC, in which internal structures may be switched on and off. In addition also other measures may be provided to suppress the temporal variation of the pin capacitance, for example suitable transistor circuits and transistor devices, respectively.

What is claimed is:

1. A sensor system comprising a first sensor device and a second capacitive sensor device configured to detect a movement of an object relative to a detection surface without touching it, wherein the sensor system is configured to be operated in a first mode of operation using the first sensor device and in a second mode of operation using the second sensor device, wherein the sensor system is configured to be switched over from the first mode of operation into the second mode of operation, wherein the second capacitive sensor device comprises a number of second sensor electrodes, and wherein in the sensor system at least in the second mode of operation at least one signal path connected with a predetermined fixed electric potential is connected in parallel with a parasitic capacitance connected with an input of the first sensor device.

2. The sensor system of claim 1, wherein the predetermined fixed electric potential comprises at least one of ground potential, supply voltage, half of the supply voltage, and an electric potential between ground potential and supply voltage.

3. The sensor system of claim 1, wherein the signal path is connected with the predetermined electric potential via an electric resistance.

4. The sensor system of claim 3, wherein through the signal path at least one terminal of the first sensor device is coupled with the predetermined electric potential via the electric resistance.

5. The sensor system of claim 1, wherein the first sensor device comprises a capacitive sensor device configured to detect a contact by an object with a detection surface, wherein the first capacitive sensor device comprises a number of first sensor electrodes, wherein in the first mode of operation a contact of an object is detected, and wherein in the second mode of operation a non-touching movement of an object is detected.

6. The sensor system of claim 5, wherein through the signal path at least one electrode of the first sensor electrodes is coupled with the predetermined electric potential via an electric resistance.

7. The sensor system of claim 1, wherein a switching device is provided in the signal path that is designed to connect the signal path with the predetermined fixed electric potential in the second mode of operation.

8. The sensor system of claim 5, wherein through the signal path at least those first sensor electrodes are each coupled via one electric resistance with the predetermined electric potential, whose distance from the second sensor electrodes is below a predetermined value.

9. A method for reducing a settling time of a second capacitive sensor device, the method comprising:

detecting a movement of an object relative to a detection surface without touching it, wherein the second capacitive sensor device is part of a sensor system that in addition comprises a first sensor device; and operating the sensor system in a first mode of operation using the first sensor device or in a second mode of operation using the second sensor device, wherein at least in the second mode of operation, connecting at least one signal path with a predetermined fixed electric potential in the sensor system, and wherein connecting the at least one signal path comprises connecting the at least one signal path in parallel to the parasitic capacitance connected with an input of the first sensor device.

10. The method of claim 9, wherein:

the first sensor device comprises a capacitive sensor device configured to detect a contact by an object with a detection surface; wherein the first capacitive sensor device comprises a number of first sensor electrodes;

in the first mode of operation, detecting a contact; and in the second mode of operation, detecting the non-touching movement.

11. The method of claim 10, further comprising connecting at least one terminal of the first capacitive sensor device with the predetermined electric potential via the electric resistance through the at least one signal path.

12. The method of claim 10, wherein through the signal path at least one electrode of the sensor electrodes of the first capacitive sensor device is connected with the predetermined electric potential via the electric resistance.

13. The method of claim 9, connecting the at least one signal path comprises connecting the at least one signal path with the predetermined electric potential via an electric resistance.

* * * * *

UNITED STATES PATENT AND TRADEMARK OFFICE
CERTIFICATE OF CORRECTION

PATENT NO. : 9,476,924 B2  
APPLICATION NO. : 14/363938  
DATED : October 25, 2016  
INVENTOR(S) : Artem Ivanov et al.

Page 1 of 1

It is certified that error appears in the above-identified patent and that said Letters Patent is hereby corrected as shown below:

Title Page,
(71) Applicant: "Microchip Technology German II GmbH & Co KG..."
---Change to--- "...Microchip Technology Germany II GmbH & Co KG..."

Signed and Sealed this
Twentieth Day of December, 2016

Michelle K. Lee
*Director of the United States Patent and Trademark Office*